(12) United States Patent
Endoh et al.

(10) Patent No.: US 6,349,085 B1
(45) Date of Patent: Feb. 19, 2002

(54) HIGH DENSITY RECORDING MEDIUM WITH PIT WIDTH TO TRACK PITCH RATIO IN THE RANGE OF 0.4 TO 0.55 FOR PUSH-PULL TRACKING SERVO CONTROL

(75) Inventors: Sohmei Endoh; Katsuhiko Ohtomo; Mitsuo Arima, all of Miyagi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/354,239

(22) Filed: Jul. 16, 1999

(30) Foreign Application Priority Data

Jul. 27, 1998 (JP) .......................................... 10-211499

(51) Int. Cl.$^7$ ................................................. G11B 7/24
(52) U.S. Cl. .................................. 369/275.4; 369/275.3
(58) Field of Search ........................... 369/275.4, 275.1, 369/275.3, 275.2, 13, 59.1, 110.01, 112.01, 109.01, 53.41, 277, 284, 44.26, 100, 53.1, 53.11, 32

(56) References Cited

U.S. PATENT DOCUMENTS

| | | | |
|---|---|---|---|
| 5,220,556 A | 6/1993 | Shimizu | 369/275.1 |
| 5,689,495 A | 11/1997 | Tsuchiya et al. | 369/275.4 |
| 5,777,981 A | 7/1998 | Sugaya et al. | 369/275.4 |
| 5,838,654 A * | 11/1998 | Kagawa et al. | 369/275.1 |
| 5,896,367 A * | 4/1999 | Tsuchiya et al. | 369/275.4 |
| 6,058,100 A * | 5/2000 | Mieda et al. | 369/275.4 |

FOREIGN PATENT DOCUMENTS

EP 0553541 A1 8/1993

OTHER PUBLICATIONS

Patent Abstracts of Japan, JP 8–235642, Published Sep. 13, 1996, Seiko Epson Corp.

* cited by examiner

*Primary Examiner*—Ali Neyzari
(74) *Attorney, Agent, or Firm*—Oblon, Spivak, McClelland, Maier & Neustadt, P.C.

(57) ABSTRACT

In an optical recording medium having formed along recording tracks thereon pits indicative of information signal, a ratio Pw/Tp where Pw is the width of the pit and Tp is the pitch of the tracks is within a range of 0.4 to 0.55. The push-pull method or differential push-pull method is adopted for tracking servo control of the optical recording medium.

3 Claims, 2 Drawing Sheets

HIGH DENSITY RECORDING MEDIUM WITH PIT WIDTH TO TRACK PITCH RATIO IN THE RANGE OF 0.4 TO 0.55 FOR PUSH-PULL TRACKING SERVO CONTROL

BACKGROUND OF THE INVENTION

1. Field of the Invention

The present invention relates to an optical recording medium having formed thereon along its recording tracks pits indicative of information signal, a master for use to produce the optical recording medium, and an optical recording and/or reproducing apparatus for reading or writing information signal from or to the optical recording medium by irradiating a light to the optical recording medium.

2. Description of Related Art

As the optical recording media, disc-shaped ones are used to and/or from which information signal is optically written and/or read. They are called "optical disc" and include a read-only optical disc having a substrate on which pits for data are formed beforehand and from which data is only read, a magneto-optical disc to and/or from which data is written and/or read by the use of the magneto-optical effect, and a phase-change optical disc to and/or from which data is written and/or read by the use of the phase change of a recording layer of the disc. It should be noted that normally in the optical discs such as magneto-optical disc and phase-change optical disc, pits for address information, etc. are also formed on the disc substrate beforehand.

In the optical disc drives for compact disc (CD) mini disc (MD), etc., the three-spot method is employed for tracking servo control. The 3-spot method is such that a light incident upon an optical disc is split into a main beam to be projected to the center of a recording track, a first sub beam for projection to a position leading the main beam, and a second sub beam for projection to a position following the main beam. The first sub beam is projected perpendicularly to the track direction to a position deviated +¼ of the track from the central spot and the second sub beam is projected perpendicularly to a position deviated −¼ of the track from the central spot.

Thus, a signal necessary for the tracking servo control is obtained by detecting the first and second sub beams reflected from the optical disc. Namely, in the 3-spot method, a difference is determined between a sum signal derived from detection of a whole reflected light of the first sub beam from the optical disc and a sum signal derived from the detection of a whole reflected light of the second sub beam from the optical disc and it is used in the 3-spot method as a signal for the tracking servo control.

For tracking servo control by the 3-spot method in write to and/or read from an optical disc having formed on a disc substrate pits corresponding to data beforehand, it is necessary to set a ratio Pw/Tp (where Pw is a pit width and Tp is a track pitch) to 0.4 or so because the sum signal cannot sufficiently be modulated if the ratio Pw/Tp is larger than such a value.

In the optical discs such as CD, MD, etc., the pit width Pw is on the order of 0.5 to 0.6 μm and track pitch Tp is on the order of 1.60 μm. Therefore, in such optical discs, the ratio Pw/Tp is smaller than 0.4, which assures that the tracking servo control by the 3-spot method can be effected stably.

The optical recording media such as optical discs have been required to have an increasing larger recording density. To this end, the pit width should be smaller while the track pitch be also smaller, for example. If the pit width is made too small, no optical reproduction of data from the optical recording media is possible. Therefore, it has been difficult to attain a high recording density with the conventional optical recording media by reducing the track pitch thereof.

Accordingly, the present invention has an object to overcome the above-mentioned drawbacks of the prior art by providing an optical recording medium in which data can be written highly densely.

The present invention has another object to provide a master for use to produce such an optical recording medium capable of writing data with a high density.

The present invention has a further object to provide an optical recording and/or reproducing apparatus adapted to write and/or read data to and/or from the optical recording medium.

SUMMARY OF THE INVENTION

The above object can be attained by providing an optical recording medium having formed along recording tracks thereon pits indicative of information signal so that a ratio Pw/Tp where Pw is the width of the pit and Tp is the pitch of the tracks is within a range of 0.4 to 0.55.

It should be noted that the optical recording medium should preferably be subjected to tracking servo control by the push-pull method or differential push-pull method.

In the optical recording medium according to the present invention, the ratio Pw/Tp of 0.4 to 0.55 between the pit width Pw and tack pitch Tp is larger than those in the conventional optical recording media. Therefore, the optical recording medium according to the present invention is capable of a high density recording with the track pitch Tp being small while the pit width Pw is not so much narrowed. Note that even if the ratio Pw/Tp between the pit width Pw and tack pitch Tp is set large, tracking servo control can be done with a sufficient stability by the push-pull method or differential push-pull method, not by the 3-spot method.

Also the above object can be attained by providing a master for use to produce the optical recording medium according to the present invention, the optical recording medium having formed thereon along recording tracks thereon pits indicative of information signal so that a ratio Pw/Tp where Pw is the width of the pit and Tp is the pitch of the tracks is within a range of 0.4 to 0.55 .

Further the above object can be attained by providing an optical recording and/or reproducing apparatus adapted to write and/or read data to and/or from the optical recording medium according to the present invention by irradiating light to the optical recording medium, the optical recording medium having formed thereon along recording tracks thereon pits indicative of information signal so that a ratio Pw/Tp where Pw is the width of the pit and Tp is the pitch of the tracks is within a range of 0.4 to 0.55.

It should be noted that the push-pull method or differential push-pull method should preferably be employed for tracking servo control of the optical recording medium.

These objects and other objects, features and advantages of the present intention will become more apparent from the following detailed description of the preferred embodiments of the present invention when taken in conjunction with the accompanying drawings.

DETAILED DESCRIPTION OF THE PREFERRED EMBODIMENTS

Figure 1:
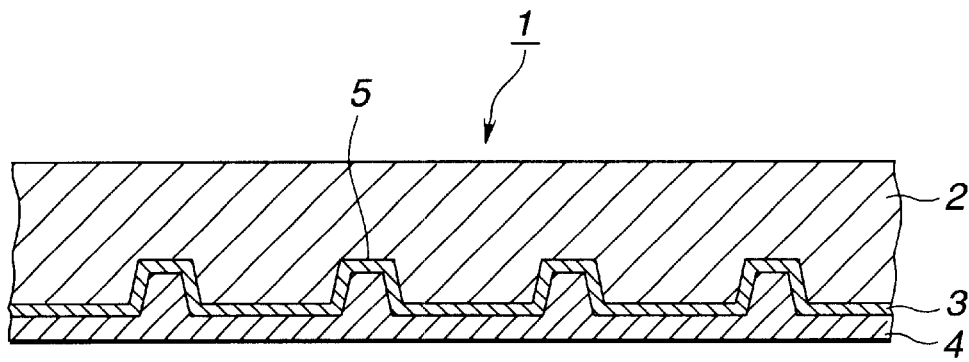
FIG. 1 is a sectional view, enlarged in scale, of the essential portion of a read-only optical disc according to the present invention.

Referring now to FIG. 1, a read-only optical disc according to the present invention is illustrated in the form of a sectional view enlarged in scale of the essential portion thereof. The optical disc is generally indicated with a reference numeral 1.

Optical Disc

The optical disc 1 is formed to have a disc-like shape. As shown, it comprises a disc substrate 2 formed from polymethyl methacrylate (PMMA), polycarbonate (PC) or the like, a light reflective layer 3 formed from aluminum (Al), and a protective layer 4 to protect the light reflective layer 3.

Figure 2:
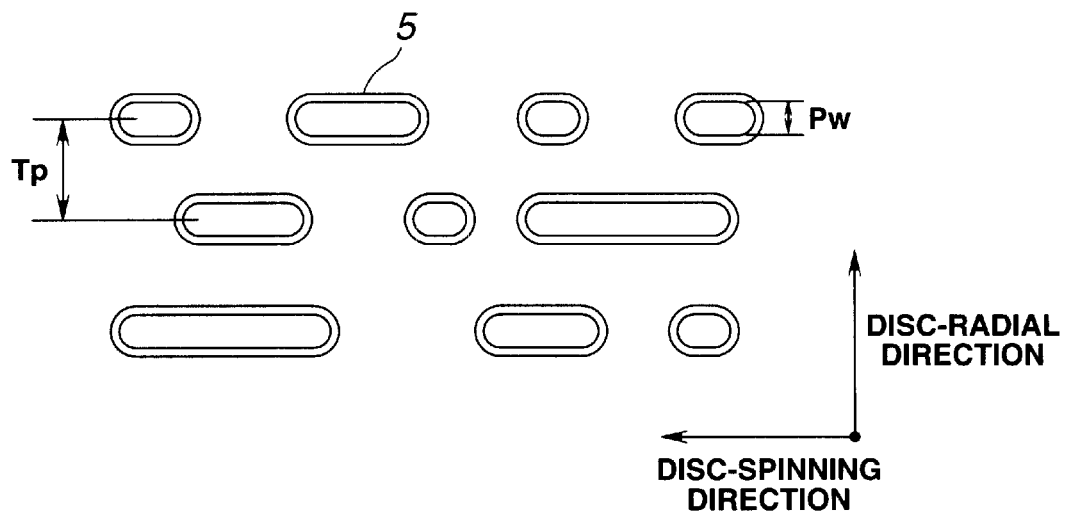
FIG. 2 is a view, enlarged in scale, of a part of the recording area of the example of optical disc in FIG. 1.

FIG. 2 is a view, enlarged in scale, of a part of the recording area of the example of optical disc in FIG. 1. As seen, the optical disc 1 has already formed thereon pits 5 corresponding to information signal. The pits 5 are formed spirally or concentrically along the recording tracks. In the optical disc 1 according to the present invention, the ratio Pw/Tp (Pw: pit width, Tp: track pitch) is within a range of 0.4 to 0.55. That is, when the track pitch Tp is 0.95 $\mu$m, the pit width Pw is 0.38 to 0.52 $\mu$m.

As in the above, the ratio Pw/Tp between pit width Pw and track pitch Tp in this optical disc 1 is 0.4 to 0.55, which is larger than that in the conventional optical discs. Therefore, the track pitch Tp can be made smaller without reducing the width Pw of the pits 5 so much, thereby permitting to attain a higher density of recording. It should be noted that even with such a large ratio Pw/Tp between width Pw of the pits 5 and track pitch Tp, the push-pull method or differential push-pull method, not the 3-spot method, can be used to assure a sufficiently stable tracking servo control.

The optical recording and/or reproducing apparatus according to the present invention is adapted for use with the optical disc 1, as the recording medium, in which the ratio Pw/Tp between width Pw of the pits 5 and track pitch Tp ranges from 0.4 to 0.55 as mentioned above. For recording and/or reproduction, a light beam is irradiated to the recording medium and the push-pull method or differential push-pull method is used to detect a tracking servo error signal from a reflected light from the recording medium to thereby effect tracking servo control. In this optical recording and/or reproducing apparatus, the push-pull method or differential push-pull method is used for a tracking servo control which can stably be done even with an optical disc having large ratio Pw/Tp.

Laser Cutting Apparatus

Figure 3:
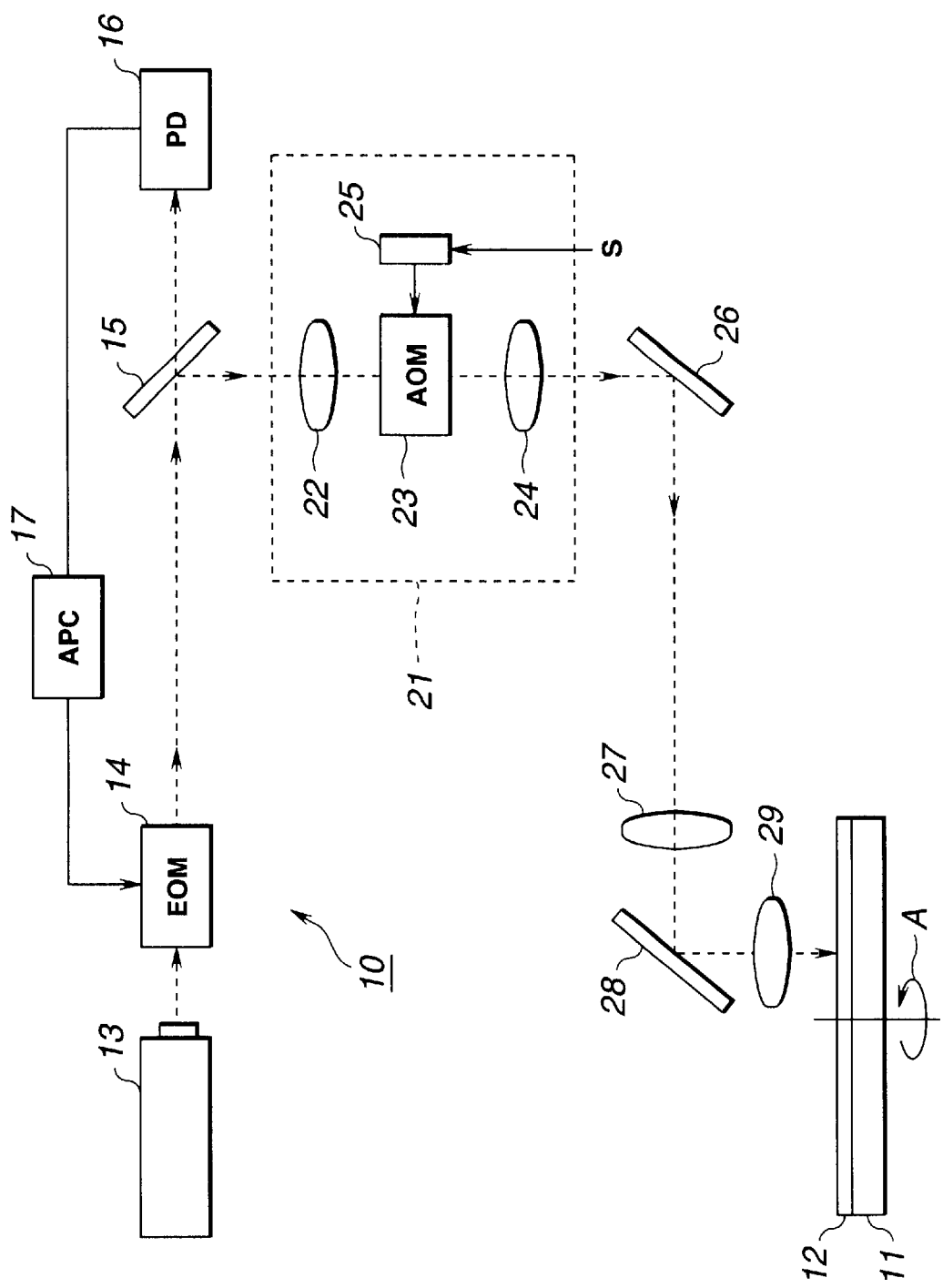
FIG. 3 is a schematic illustration of an optical system used in an example of a laser cutting apparatus used to prepare a master for the optical recording medium according to the present invention and thus produce the optical recording medium.
Figure 1:
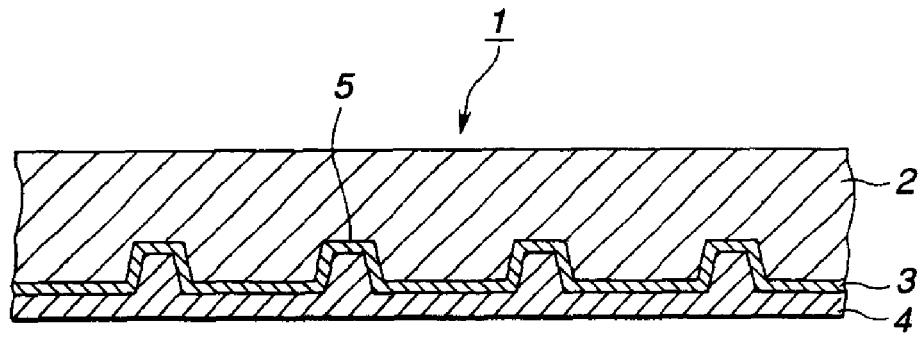
Figure 2:
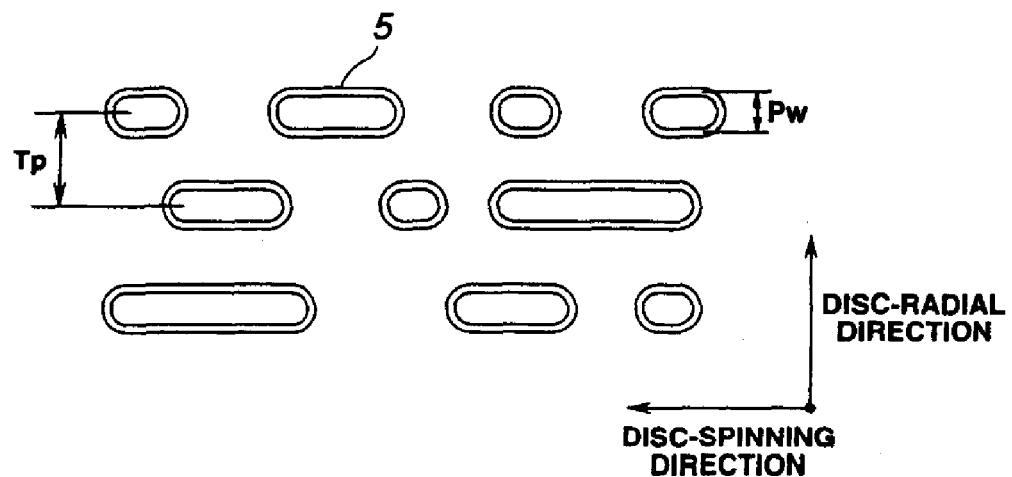

For production of the optical disc having been described in the foregoing, a laser cutting apparatus is used to prepare a master for the optical disc 1. An example of the laser cutting apparatus used for preparation of the recording medium according to the present invention will be described below with reference to FIG. 3. FIG. 3 is a schematic illustration of an optical system used in the laser cutting apparatus used to prepare the master for the optical recording medium according to the present invention and thus produce the optical recording medium.

The laser cutting apparatus is generally indicated with a reference numeral 10 in FIG. 3. It is intended to expose to light a photoresist 12 applied on a glass substrate 11 to form latent images corresponding to pits 5 on the optical disc 1. For forming a latent image on the photoresist 12 in the laser cutting apparatus 10, the glass substrate 11 having the photoresist 12 applied thereon is mounted on a rotation drive provided on a moving optical table. For exposure of the photoresist 12 to light, the glass substrate 11 is rotated by the rotation drive in the direction of arrow A so that the entire surface of the photoresist 12 is exposed to light in a predetermined pattern, while it is being moved by the moving optical table in parallel.

The laser cutting apparatus 10 comprises a light source 13 which emits a laser light, an electro-optical modulator (EOM) 14 which adjusts the intensity of the laser light emitted from the light source 13, a beam splitter 15 which splits the laser light from the EOM 14 into a reflected light and transmitted light, a photodetector (PD) 16 which detects the laser light having passed through the beam splitter 15, and a automatic power controller (APC) 17 which applies the EOM 14 with a signal field to adjust the intensity of the laser light from the EOM 14.

In the laser cutting apparatus 10, the laser light coming from the light source 13 is first adjusted to have a predetermined intensity by the EOM 14 driven with the signal field applied from the APC 17.

The light source 13 may be any laser source selected from various types being currently available, but it should preferably be a one which can emit a laser light having a relative short wavelength. More specifically, a Kr laser which emits a laser light of 413 nm in wavelength $\lambda$, a He—Cd laser which emits a laser light of 442 nm in wavelength $\lambda$, etc. are suitable for use as the light source 13.

The laser light emitted from the EOM 14 is split by the beam splitter 15 into a reflected light and transmitted light.

The intensity of the laser light having passed through the beam splitter 15 is detected by the PD 16 which delivers a signal corresponding to the light intensity to the APC 17. According to the signal from the PD 16, the APC 17 will adjust a signal field for application to the EOM 14 so that the light intensity detected by the PD 16 is constant at a predetermined level. Thus, an automatic power control is done to make constant the intensity of the laser light emitted from the EOM 14, thereby providing a noiseless, stable laser light.

On the other hand, the laser light reflected by the beam splitter 15 impinges on the photoresist 12 as will further described below. The laser light will be guided by a modulating optical system 21 through which its intensity is modulated.

As shown in FIG. 3, the laser beam incident upon the modulating optical system 21 is condensed by a condenser lens 22, then it is incident upon an acousto-optical modulator (AOM) 23 by which its intensity is modulated for correspondence to a desired exposure pattern. Note that the acousto-optical element used in the AOM 23 should preferably be a one made of tellurium oxide (TeO$_2$). Then the laser beam having the intensity thereof modulated by the AOM 23 is made a parallel beam by a collimator lens 24 and emitted from the modulating optical system 21.

The AOM 23 is provided with a driver 25 to drive the AOM 23. For exposure of the photoresist 12 to the laser beam, a signal S corresponding to a desired exposure pattern is supplied to the driver 25 which in turn will drive the AOM 23 according to the signal S to modulate the intensity of the laser beam.

More particularly, for forming on the photoresist 12 a latent image of a pit pattern having been subject to a 2–8 modulation, for example, a modulation signal corresponding to the 2–8 modulated pit pattern is supplied to the driver 25 which will drive the AOM 23 according to the modulation signal. Thus the intensity of the laser beam is modulated correspondingly to the 2–8 modulated pit pattern.

The laser beam thus modulated in intensity by the modulating optical system 21 is reflected by a mirror 26 and guided horizontally and in parallel to the moving optical table. The laser beam is passed through a magnifying lens 27 to have a predetermined diameter, reflected by a mirror 28 and guided to an objective lens 29 which will focus the laser beam on the photoresist 12. Thus, the photoresist 12 is exposed to the laser beam and will have a latent image formed thereon. At this time, the glass substrate 11 is rotated by the rotation drive in the direction of arrow A so that the entire surface of the photoresist 12 is exposed to the laser beam in a predetermined pattern, while it is being moved by the moving optical table in parallel. As a result, a latent image corresponding to an irradiated orbit of the leaser beam will be formed on the entire photoresist 12.

The objective lens 29 for focusing the laser beam on the photoresist 12 should preferably have a large numerical aperture (NA), and more specifically it should optimally have an NA of 0.9 or so.

Also, for exposure of the photoresist 12 to the laser beam, the laser beam may be changed in diameter by the magnifying lens 27 as necessary to adjust the effective NA for the objective lens 29. Thereby the spot diameter of the laser beam focused on the surface of the photoresist 12 can be changed.

Production of Optical Disc

Next, the production of the optical disc 1 having been described in the above with reference to FIGS. 1 and 2 will be described herebelow:

For production of an optical disc, first a master is prepared which has a pattern of convexes and concavities corresponding to the pits 5 which will be formed on the disc substrate 2 of the optical disc 1.

In the master preparing process, first the disc-shaped glass substrate 11 having been polished at the surface thereof is washed and dried, and thereafter it is coated with the photoresist 12 as a photosensitive material. Then, in the laser cutting apparatus 10, the photoresist 12 is exposed to light to form latent images corresponding to the pits 5 on the photoresist 12.

Note that for preparation of evaluation optical discs as will be described later, a Kr laser which emits a laser light of 413 nm in wavelength λ was used as the light source 13 in the laser cutting apparatus 10 and an objective lens of 0.9 in NA was used as the objective lens 29 to focus the laser beam on the photoresist 12.

Also, for preparation of the evaluation optical discs, a lens of 80 mm in focal distance was used as the condenser lens 22 and a lens of 80 mm in focal length was used as the collimator lens 24, in the modulating optical system 21 of the laser cutting apparatus 10. Further, a lens of 60, 80 or 100 mm in focal length was used as the magnifying lens 27.

For forming latent images corresponding to the pits 5 on the photoresist 12 by exposing to the laser beam the photoresist 12 in the laser cutting apparatus 10, the laser beam is modulated in intensity by the modulating optical system 21. More particularly, a modulation signal corresponding to a pit pattern subjected to a 2–8 modulation, for example, is supplied to the driver 25 which will drive the AOM 23 according to the modulation signal to modulate the intensity of the laser beam for correspondence to the 2–8 modulated pit pattern. The laser beam having the intensity thereof thus modulated is focused on the photoresist 12 through the objective lens 29 to expose the photoresist 12 to the laser beam and thus form images corresponding to the pits 5 on the photoresist 12.

When the photoresist 12 is exposed to the laser beam to form the latent images corresponding to the pits 5 on the photoresist 12, the glass substrate 11 on which the photoresist 12 is applied is rotated at a predetermined speed while being moved in parallel at a predetermined speed.

More specifically, for preparation of the evaluation optical discs, the glass substrate 11 was rotated at such a speed that the laser beam-defined focal spot is moved in relation to the photoresist 12 at a linear speed of 1.0 m/sec. The glass substrate 11 was translated radially by the moving optical table at a rate of 0.95 μm per turn (that is, the track pitch Tp) radially.

By exposing the photoresist 12 to the laser beam as in the above, the latent images corresponding to the pit pattern subjected to the 2–8 modulation, for example, are formed spirally or concentrically on the photoresist 12.

After the latent images have been formed on the photoresist 12, the glass substrate 11 is mounted on a turntable of a developing machine with the photoresist-coated side thereof upside. While the glass substrate 11 is being rotated by turning the turntable, a developer is dripped onto the photoresist 12 for development of the photoresist 12, thereby forming on the glass substrate 11 a convex-concave pattern corresponding to the pits 5.

A conductive layer of Ni or the like is formed on the convex-concave pattern by the electroless plating. Thereafter, the glass substrate 11 having the conductive layer formed thereon is installed on an electrocasting apparatus. An electroplating layer is formed to a thickness of about 300±5 μm on the conductive layer by the electroplating. After that, the electroplating layer is separated, and the separated electroplating layer was washed in acetone or the like to remove the photoresist 12 remaining on the side of the electroplating layer to which the convex-concave pattern has been transferred.

Thus, a master made of a plating metal (Ni or the like) and to which the convexconcave pattern formed on the photoresist 11 is transferred, namely, a master having formed thereon the convex-concave pattern corresponding to the pits 5, is completed.

Next, the photopolymer method (so-called 2P method) is used to make a disc substrate 2 having transferred thereto the surface shape of the master.

More particularly, photopolymer is coated smoothly on the surface of the disc substrate 2 on which the convex-concave pattern of the master is formed, to thereby form a photopolymer layer. Next, a base plate is closely attached on the photopolymer layer with care for no bubble or dust to mix in the photopolymer layer. The base plate should be formed from a polymethyl methacrylate of 1.49 in refractive index and 1.2 mm in thickness, for example.

Thereafter, the photopolymer layer is exposed to ultraviolet rays to cure the photopolymer layer. Then, the master is separated. A disc substrate (so-called 2P disc) will thus be obtained which has the surface shape of the master.

In the foregoing, use of the 2P method for preparation of the disc substrate 2 for accurate transfer of a convexconcave pattern formed on the master to the disc substrate 2 has been described by way of example. For mass production of the disc substrate 2, however, it is needless to say that a transparent resin such as polymethyl methacrylate, polycarbonate or the like may be used to prepare the disc substrate 2 by injection molding.

Next, in the layer forming process, a light reflective layer 3 and protective layer 4 are formed on the disc substrate 2 having transferred thereto the surface shape of the master. More specifically, the light reflective layer 3 of Al or the like is formed by evaporation or sputtering on the surface of the disc substrate 2 on which the convex-concave pattern is formed. Thereafter, an ultraviolet-curable resin is coated on the light reflective layer 3 by spin coating, it is cured by exposure to ultraviolet rays to form the protective layer 4.

In this way, the optical disc 1 is completed.

Evaluation of Optical Disc

Next, a plurality of evaluation optical discs different in width Pw of the pits 5 from one another was prepared and evaluated. The results of the evaluation will be described below:

The width Pw of the pits 5 was controlled by changing the power of the laser beam used in preparation of the master and changing the focused spot diameter of the laser beam with the magnifying lens 27 exchanged one for another. That is, the laser beam for forming latent images corresponding to the pits 5 was changed in power and focused spot diameter to prepare the different masters and the masters were used to prepare the evaluation optical discs by the 2P method. It should be noted that the disc substrate of the evaluation optical discs was formed from polymethyl methacrylate of 1.49 in refractive index.

The plurality of evaluation optical discs different in width Pw of the pits 5, thus prepared, was tested for tracking servo controllability and jitter of reproduced signal. For evaluation of the tracking servo controllability, each of the evaluation optical discs was subjected to tracking servo control by the 3-spot method, push-pull method and differential push-pull method. For these tracking servo controllability evaluation and jitter measurement, an optical pickup using a laser of 650 nm in wavelength λ and objective lens NA of 0.52 was adopted.

Table 1 shows the results of tracking servo controllability evaluation and measurement of reproduced signal jitter along with the exposure conditions for preparation of the masters and data of the pit pattern formed on the optical disc 1. It should be noted that the width Pw of the pits 5 formed on the evaluation optical discs was not measured actually on the pit patterns formed on the optical discs themselves but on the pit patterns formed on the masters by a scanning electron microscope (SEM). That is to say, it was assumed that the convex-concave pattern fonned on the master has been transferred to the disc substrate with a high accuracy. The shape of the convex-concave pattern formed on the master was measured and the measured result was used as the width Pw of the pits 5 formed on the evaluation optical disc.

TABLE 1

|  |  | Evaluation optical discs | | | | |
|---|---|---|---|---|---|---|
|  |  | No. 1 | No. 2 | No. 3 | No. 4 | No. 5 |
| Exposure conditions | Focal distance of magnifying lens | 60 nm | 60 nm | 80 nm | 80 nm | 100 nm |
|  | Power of laser beam | 0.6 mW | 0.9 mW | 0.5 mW | 0.7 mW | 0.7 mW |
| Pit pattern formed on optical disc | Pit width Pw | 380 nm | 420 nm | 472 nm | 523 nm | 600 nm |
|  | Track pitch Tp | 950 nm | 950 nm | 950 nm | 950 nm | 950 nm |
|  | Pw/Tp | 0.40 | 0.44 | 0.50 | 0.55 | 0.63 |
| Tracking servo controllability | By 3-spot method | Stable | Unstable | Unstable | Unstable | Unstable |
|  | By push-pull method | Stable | Stable | Stable | Stable | Stable |
|  | By differential push-pull method | Very stable | Very stable | Very stable | Very stable | Very stable |
| Reproduced signal jitter |  | 5.7% | 5.8% | 6.2% | 7.5% | 9.2% |

As seen from Table 1, the tracking servo control by the 3-spot method is not stable when the ratio Pw/Tp between the width Pw of the pits 5 and track pitch Tp exceeds 0.4.

A tacking servo control by the push-pull method or differential push-pull method can stably be done even when the ratio Pw/Tp exceeds 0.4.

That is to say, a stable tracking servo control by the push-pull method or differential push-pull method can stable be effected even with an optical disc 1 in which the ratio Pw/Tp is 0.4 or more.

When the ratio Pw/Tp is large, the track pitch Tp can be reduced while the width Pw of the pits 5 is not so much reduced, whereby a high density of recording can be attained. Namely, the optical disc 1 according to the present invention permits to record with a high density with only the track pitch Tp reduced with the width Pw of the pits 5 not reduced so much.

If the ratio Pw/Tp is too large, the jitter of reproduced signal is large as seen from Table 1. Generally, the jitter of reproduced signal has to be on the order of less than 8%. According to the present invention, the ration Pw/Tp is defined to be less than 0.55. As seen from Table 1, when the ratio Pw/Tp is less than 0.55, the jitter of reproduced signal is less than 8%.

It should be appreciated that the present invention is widely applicable to optical recording media on which pits indicative of information signal are formed along the recording tracks and masters for use to produce such optical recording medium. The present invention is not limited to read-only optical recording media. That is, the present invention covers even optical recording media in which grooves, etc. are formed for write of data, so long as the media have a region in which pits indicative of information signal are formed along the recording tracks.

As having been described in the foregoing, the present invention provides an optical recording medium having narrower tracks to attain a higher density of recording.

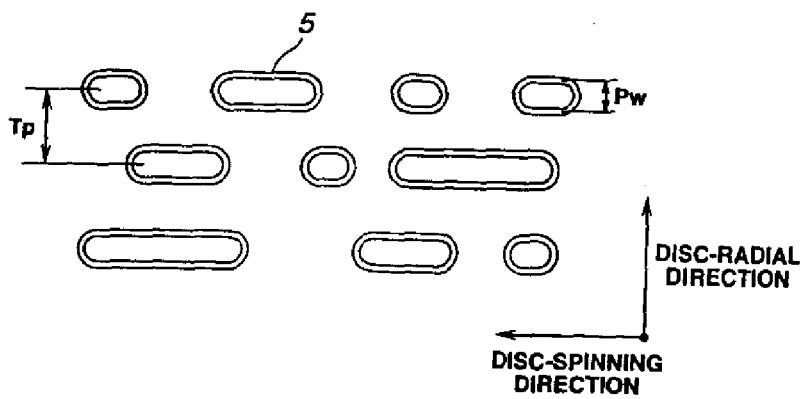

What is claimed is:

1. An optical recording medium having pits aligned in adjacent pitted portions of spaced apart recording tracks extending along a surface of the optical recording medium, the pits indicating an information signal and being configured with portions extending from the surface into a body portion of the optical recording medium, wherein a center-to-center separation between aligned pits in each of the adjacent pitted portions defines a track pitch dimension Tp for each recording track and the pits have a common width dimension Pw with a ratio Pw/Tp being within a range of 0.4 to 0.55, and further wherein the surface of the optical recording medium where the spaced apart recording tracks and spaces between the spaced apart recording tracks are formed is all at a same continuous surface level except for the pits aligned in the adjacent pitted portions and the optical recording medium is adapted for tracking servo control by one of a push-pull method and a differential push-pull method.

2. A master configured to produce an optical recording medium with pits aligned in adjacent pitted portions of spaced apart recording tracks extending along a surface of the optical recording medium, the pits indicating an information signal and being configured with portions extending from the surface into a body portion of the optical recording medium, wherein a center-to-center separation between aligned pits in each of the adjacent pitted portions defines a track pitch dimension Tp for each recording track and the pits have a common width dimension Pw with a ratio Pw/Tp being within a range of 0.4 to 0.55, and further wherein the surface of the optical recording medium where the spaced apart recording tracks and spaces between the spaced apart recording tracks are formed is all at a same continuous surface level except for the pits aligned in the adjacent pitted portions and the optical recording medium is adapted for tracking servo control by one of a push-pull method and a differential push-pull method.

3. An optical recording and/or reproducing apparatus adapted to write and/or read data to and/or from an optical recording medium by irradiating light to the optical recording medium, wherein the optical recording medium has pits aligned in adjacent pitted portions of spaced apart recording tracks extending along a surface of the optical recording medium, the pits indicating an information signal and being configured with portions extending from the surface into a body portion of the optical recording medium, further wherein a center-to-center separation between aligned pits in each of the adjacent pitted portions defines a track pitch dimension Tp for each recording track and the pits have a common width dimension Pw with a ratio Pw/Tp being within a range of 0.4 to 0.55, and further wherein the surface of the optical recording medium where the spaced apart recording tracks and spaces between the spaced apart recording tracks are formed is all at a same continuous surface level except for the pits aligned in the adjacent pitted portions and the optical recording medium is adapted for tracking servo control by one of a push-pull method and a differential push-pull method.

\* \* \* \* \*

UNITED STATES PATENT AND TRADEMARK OFFICE
CERTIFICATE OF CORRECTION

PATENT NO. : 6,349,085 B1  
DATED : February 19, 2002  
INVENTOR(S) : Sohmei Endoh et al.

It is certified that error appears in the above-identified patent and that said Letters Patent is hereby corrected as shown below:

<u>Column 8,</u>  
Line 5, please change "fonned" to -- formed --;  
Line 32, please change "tacking" to -- tracking --.

Signed and Sealed this

Fourth Day of June, 2002

Attest:

Attesting Officer

JAMES E. ROGAN  
*Director of the United States Patent and Trademark Office*

UNITED STATES PATENT AND TRADEMARK OFFICE
CERTIFICATE OF CORRECTION

PATENT NO. : 6,349,085 B1
DATED : February 19, 2002
INVENTOR(S) : Sohmei Endoh et al.

It is certified that error appears in the above-identified patent and that said Letters Patent is hereby corrected as shown below:

The title page consisting of the illustrated figure 2 should be deleted to appear as per attached title page.

The sheet of drawings consisting figure 2 should be deleted to appear as per attached sheet.

Signed and Sealed this

Second Day of August, 2005

JON W. DUDAS
*Director of the United States Patent and Trademark Office*

(12) United States Patent
Endoh et al.

(10) Patent No.: US 6,349,085 B1
(45) Date of Patent: Feb. 19, 2002

(54) HIGH DENSITY RECORDING MEDIUM WITH PIT WIDTH TO TRACK PITCH RATIO IN THE RANGE OF 0.4 TO 0.55 FOR PUSH-PULL TRACKING SERVO CONTROL

(75) Inventors: Sohmei Endoh; Katsuhiko Ohtomo; Mitsuo Arima, all of Miyagi (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 09/354,239

(22) Filed: Jul. 16, 1999

(30) Foreign Application Priority Data

Jul. 27, 1998 (JP) ............................................ 10-211499

(51) Int. Cl.$^7$ ................................................ G11B 7/24
(52) U.S. Cl. .............................. 369/275.4; 369/275.3
(58) Field of Search ........................... 369/275.4, 275.1, 369/275.3, 275.2, 13, 59.1, 110.01, 112.01, 109.01, 53.41, 277, 284, 44.26, 100, 53.1, 53.11, 32

(56) References Cited

U.S. PATENT DOCUMENTS

| | | | |
|---|---|---|---|
| 5,220,556 A | 6/1993 | Shimizu | 369/275.1 |
| 5,689,495 A | 11/1997 | Tsuchiya et al. | 369/275.4 |
| 5,777,981 A | 7/1998 | Sugaya et al. | 369/275.4 |
| 5,838,654 A * | 11/1998 | Kagawa et al. | 369/275.1 |
| 5,896,367 A * | 4/1999 | Tsuchiya et al. | 369/275.4 |
| 6,058,100 A * | 5/2000 | Mieda et al. | 369/275.4 |

FOREIGN PATENT DOCUMENTS

EP    0553541 A1    8/1993

OTHER PUBLICATIONS

Patent Abstracts of Japan, JP 8-235642, Published Sep. 13, 1996, Seiko Epson Corp.

* cited by examiner

*Primary Examiner*—Ali Neyzari
(74) *Attorney, Agent, or Firm*—Oblon, Spivak, McClelland, Maier & Neustadt, P.C.

(57) ABSTRACT

In an optical recording medium having formed along recording tracks thereon pits indicative of information signal, a ratio Pw/Tp where Pw is the width of the pit and Tp is the pitch of the tracks is within a range of 0.4 to 0.55. The push-pull method or differential push-pull method is adopted for tracking servo control of the optical recording medium.

3 Claims, 2 Drawing Sheets